(12) United States Patent
Lee et al.

(10) Patent No.: US 6,902,660 B2
(45) Date of Patent: Jun. 7, 2005

(54) METHOD OF MANUFACTURING PRINTED CIRCUIT BOARD AND MULTI-LAYERED PCB

(75) Inventors: Hyuek Jae Lee, Daejeon (KR); Jin Yu, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 218 days.

(21) Appl. No.: 10/231,052

(22) Filed: Aug. 30, 2002

(65) Prior Publication Data

US 2004/0035711 A1 Feb. 26, 2004

(30) Foreign Application Priority Data

Aug. 21, 2002 (KR) ........................................ 2002-49550

(51) Int. Cl.⁷ .............................. C25D 5/02; C25D 1/00
(52) U.S. Cl. ............................ 205/125; 205/67; 205/78
(58) Field of Search ............................ 205/67, 78, 125

(56) References Cited

U.S. PATENT DOCUMENTS

| | | | |
|---|---|---|---|
| 4,912,020 A | * 3/1990 | King et al. | ................. 430/311 |
| 5,046,238 A | * 9/1991 | Daigle et al. | ................. 29/830 |
| 5,077,084 A | 12/1991 | Konotsune et al. | ........... 427/96 |
| 6,296,949 B1 | 10/2001 | Bergstresser et al. | ....... 428/626 |
| 6,521,530 B2 | * 2/2003 | Peters et al. | ................ 438/667 |

* cited by examiner

Primary Examiner—Edna Wong
(74) Attorney, Agent, or Firm—Antonelli, Terry, Stout & Kraus, LLP

(57) ABSTRACT

Disclosed is a fabrication method of a printed circuit board, consisting of plating a metal on a pattern-formed metallic substrate to form a conductive metal line; forming a polymer layer as a base substrate over the conductive metal line-formed metallic substrate and drying the formed polymer layer; forming a via hole in the polymer layer, followed by plugging the formed via hole by electroplating; and removing the metallic substrate. The method is advantageous in terms of maximum efficiency of use of the surface area of PCB, and fineness and high integration of circuits because of not requiring an additional etching process.

10 Claims, 1 Drawing Sheet

METHOD OF MANUFACTURING PRINTED CIRCUIT BOARD AND MULTI-LAYERED PCB

BACKGROUND OF THE INVENTION

1. Field of the Invention

The present invention pertains, in general, to manufacturing methods of printed circuit boards, and more specifically, to a method of manufacturing a printed circuit board maximizing efficiency of use of its surface area, and having a fine pattern of its circuit and high integration of the circuit, due to requiring no etching process.

2. Description of the Prior Art

Generally, in conventional fabrication methods of a printed circuit board (PCB), an etching process of a copper foil on a polymer film negatively affects high integration of electronic parts, attributable to fundamental limitations of the etching process. In this regard, U.S. Pat. No. 5,077,084, using the copper foil (photoresist (PR) pattern/copper foil/polymer), discloses a technique of bonding a polymer to the copper foil by casting. However, this technique is disadvantageous in terms of formation of oxides on the copper foil or low bondability of the copper foil. In addition, an etching process (in particular, wet etching) for use in the formation of patterns results in a nonuniform thickness of the cross-section of each line in the copper pattern. Thus line intervals in the copper pattern cannot be decreased. The above technique is unsuitable for application in highly integrated circuits requiring more output terminals and narrower line width.

In U.S. Pat. No. 6,296,949, there is disclosed a metallic layer for increasing bonding strength between a polymer and a conductive copper line, formed by the process of vacuum-metallization, electroless deposition or electrodeposition (copper electroplating and PR pattern/copper electroless plating/polymer) in the presence of palladium catalyst. In the case of electroless or electro deposition process, since a copper electroless plated film is much faster in etching rate than a copper electroplated film, problems such as undercut (phenomenon wherein the electroless plated film under electroplated film is etched too much) may be caused. Also, although the polymer surface should be subjected to surface modification upon use of an adhesive layer formed of the polymer, the polymer material having excellent etching resistance, for example, polyimide, is difficult to perform surface modification on. So, the above process is disadvantageous in terms of limitation of usable polymer materials. Meanwhile, in the case of the vacuum-metallization process, a production cost is increased due to vacuum process, and this process is not closely connected with other wet processes and thus cannot be efficiently applied to a continuous process including a roll-to-roll process.

On the other hand, blind via holes have been typically formed in an insulating layer on the substrate by laser or exposure, and a conductor circuit layer is formed on the surface of the insulating layer and in the via hole by means of electroless copper plating. Thusly formed conductor circuit layer is connected to the lower conductor circuit layer, thus obtaining an electrically connected structure. When the via holes are formed to be fine by a processing means such as laser, an inner surface of the via hole may be minutely grooved and the stepped cone-shaped rough surface may be formed between the inner via hole surface and the conductor layer.

When another via hole is formed above the formed via hole, the upper via hole should be formed to have a larger diameter, compared to the lower hole, with the aim of layer connection. In addition, upon formation of the insulating layer in the via hole by electroless copper plating, short-circuit of the lower conductor circuit layer is caused and inferior goods are produced.

In the case of plugging the via hole with paste, fine or deep via holes may not be completely filled. Also, layers on PCB may be cracked due to gas generated by flux added to the paste.

As for the method of laminating the bump-formed metal foil, the bump should have certain mechanical properties and the used bump is limited in its shape or size. Hence, such bumps, made by exposure during the etching process, are unsuitable for fine pitch and are limited in their use.

SUMMARY OF THE INVENTION

Leading to the present invention, the intensive and thorough research on printed circuit boards, carried out by the present inventors aiming to avoid the problems encountered in the prior art, resulted in a method wherein a pattern-formed metallic substrate is subjected to electroplating to form a conductive metal line, on which a polymer layer is formed to create a base substrate, and the metallic substrate is finally removed, whereby the printed circuit board can be fabricated having the advantages of maximum efficiency of use of surface area due to no use of dummy lines, and fineness and high integration of circuits due to requiring no etching process.

Therefore, it is an object of the present invention to provide a method of manufacturing a printed circuit board, having a maximum efficiency of use of surface area of PCB, and fineness and high integration of circuits due to not requiring an additional etching process.

It is another object of the present invention to provide a method of manufacturing a printed circuit board, which is advantageous in light of prevention of short-circuits between the upper and the lower conductor circuit layers by plugging each via hole without etching of a conductive metal line, only by means of electroplating, and achieving a complete layer connection by vertically positioning the plugged via holes on the conductor layer.

DETAILED DESCRIPTION OF THE INVENTION

Figure 1:
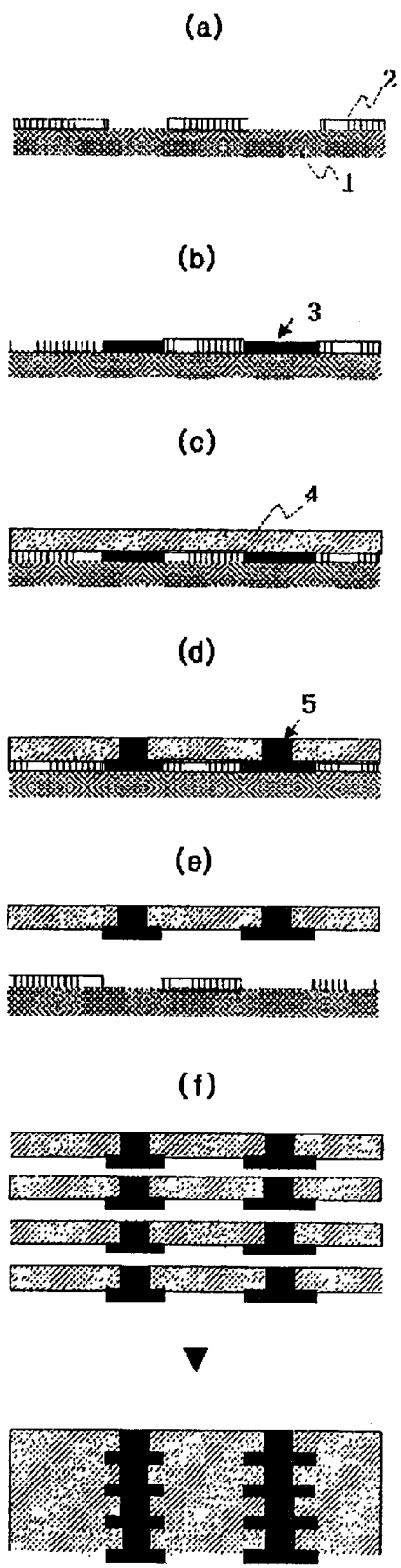
FIGS. 1a to 1f show schematically a fabrication process of a printed circuit board of the present invention.

The present invention provides a method of manufacturing a printed circuit board, comprising the steps of (a) plating a metal on a pattern-formed metallic substrate, to form a conductive metal line, (b) forming a polymer layer as a base substrate over the conductive metal line-formed metallic substrate and drying the formed polymer layer, (c) forming a via hole in the polymer layer, followed by plugging the formed via hole by means of electroplating, and (d) removing the metallic substrate.

Thusly manufactured PCB is advantageous in terms of maximized efficiency of use of surface area due to requiring no dummy lines, and fineness or high integration of the circuit is achieved because of not requiring an additional etching process.

Referring to the appended drawings (FIGS. 1a to 1f), a description will be given of the present invention, below.

In the step (a), the conductive metal lines 3 are formed between the patterns 2 on the metallic substrate (mandrel) 1

(see FIG. 1a). The pattern 2 can be formed according to known methods commonly used in this art, for example, a series of processes of coating, masking, exposure and development of a photoresist solution.

Preferably, the metallic substrate 1 is made from a material which is excellent in electroconductivity and can be readily separated from the polymer layer while hardly reacting with or not being diffused to other metal layers. The metallic substrate material is not specifically limited as long as the above requirements are satisfied, which is exemplified by stainless steel, aluminum, nickel, etc. In particular, stainless steel is readily available and is relatively weak in bondability with the conductive metal line, compared to a polymer material, thereby being favorable in separation of the polymer layer.

The conductive metal lines 3, which are plated between the patterns 2 on the metallic substrate, can be formed of various metals (see FIG. 1b), examples of which include copper, aluminum, chromium, tin, nickel, and gold. Such a metal material may be used alone or in combinations thereof.

Control of the thickness of the conductive metal lines 3 is achieved by adjusting the thickness of the pattern 2 formed on the metallic substrate. For instance, in the case where a thick copper pattern is to be formed on the metallic substrate, the useful photoresist solution for formation of the pattern is high in viscosity (>7 Pa.s). When a thin copper pattern necessary for fine pattern is required, the photoresist solution having low viscosity (<7 Pa.s) may be used. Meanwhile, for continuous processes, the photoresist in the form of a dry film may be employed. As such, the pattern is also formed according to the same procedures as in the case of using the photoresist solution, such as exposure, development, etc.

In the step (c), the polymer layer 4, serving as the base substrate, is applied over the conductive metal line-formed metallic substrate and then dried.

The polymer material used as the substrate may be properly selected by those skilled in the art and is not specifically limited, with consideration of properties of the required PCB. Such materials are exemplified by polyimides, polyimide resins and prepregs. The polymer material in liquid phase may be coated directly onto the conductive metal lines and the metallic substrate, or already prepared polymer film may be bonded to the metallic substrate by means of hot press (see FIG. 1c).

After formation of the polymer layer 4, a drying process is performed. In order to prevent the reaction between the photoresist and the polymer, the polymer layer is preferably dried at a temperature lower than the drying temperature of the photoresist upon formation of the pattern 2 on the metallic substrate. In this regard, when the photoresist has a common drying temperature of 100–120° C., the polymer layer is preferably dried at 80–110° C. If the drying process is performed at the temperature higher than the dryness temperature of the photoresist, side-reactions which are not generated at a dryness temperature of the photoresist may occur. If that happens, the conductive metal lines are difficult to separate from the photoresist due to chemical bonding between the photoresist and the formed polymer layer. In addition, the coated polymer is decreased in its properties due to the reaction with the photoresist.

Therefore, in order to prevent the reaction of the polymer layer and the photoresist and to increase bondability between the polymer layer and the conductive metal lines, an additional means may be introduced. As such a means, there are used the methods of (1) coating a coupling agent (PIQ-coupler, Hitachi Ltd, Japan) on the metallic substrate ahead of formation of the polymer layer, and (2) electroplating chromium onto the conductive metal lines, in particular, conductive copper lines, before formation of the polymer layer.

In the case of the method (1), a suitable selection of the coupling agent according to kinds of the used polymer is apparent to those skilled in the art. Chromium in the method (2), which has been typically applied as a diffusion barrier between the copper and the polymer, is selectively coated only onto the conductive metal lines and thus the chromium-plated layer need not be additionally etched. In addition, the surface of the chromium layer is roughened, whereby bondability between the chromium layer and the polymer layer can be further increased.

In the step (d), the via holes 5 are formed in the polymer layer 4 and electroplated to fill the internal parts thereof. When being formed in the polymer layer over the patterned metallic substrate, the via holes 5 are made in the opposite side of the polymer layer adjacent to the conductive metal line. So, an etching process of the copper foil as in conventional techniques is not required. In the formation of via holes, a variety of kinds of laser may be used, such as YAG, $CO_2$, UV laser, etc. (see FIG. 1d).

Upon typical formation of the via hole, the copper foil may be drilled with a YAG type laser drill but workability of a drilling process becomes very low. In the $CO_2$ type laser drill, the workability is high but the copper foil cannot be drilled, and thus the copper foil portion to be drilled is removed by an additional etching masking process. As such, an accidental error may occur.

The via hole formed according to the process of the present invention is plugged by means of electroplating, and thus the plugged via hole is vertically positioned on the conductor circuit layer. Since such via holes are electrically connected to the lower metallic substrate, an additional electrical service line or an electroless plating process is unnecessary. Further, the process of tin plating or solder plating may be performed on the metal plugged in the via holes, so as to prevent oxidation of the plugged metal and to form a bond with a conductive metal line in the other layers at low temperatures (about 200–300° C.).

In the step (e), the polymer layer 4 is finally separated from the metallic substrate 1. Since the conductive metal lines 3 are more strongly bonded to the polymer layer 4 than to the metallic substrate 1, the polymer layer comprising the via holes and the conductive metal lines having predetermined patterns can be obtained (see FIG. 1e).

The polymer layer including the via holes and the conductive metal lines, is bonded to another polymer layer under a predetermined pressure and temperature, thus forming a multi-layered structure (see FIG. 1f).

Therefore, an intermediate of the printed circuit board comprises the metallic substrate 1 having a predetermined pattern 2; the conductive metal line 3 formed on the metallic substrate 1 by metal plating; the polymer layer 4 formed on the pattern 2 and the conductive metal line 3; and the via holes 5 formed in the polymer layer 4 and plugged by electroplating.

Having generally described this invention, a further understanding can be obtained by reference to certain specific examples which are provided herein for purposes of illustration only and are not intended to be limiting unless otherwise specified.

EXAMPLE 1

On a 0.1 mm thick stainless steel having proper mechanical strength as a roll form, a photoresist (AZ3514, Client Co.) solution was coated by a screen printing method, dried and then exposed to UV according to known methods. After exposure, a development process was performed to form a predetermined pattern on the metallic substrate. Copper was plated over the surface of the pattern-formed metallic substrate using a copper sulfate (200 g/L) plating solution, thus forming conductive copper lines, on which chromium was thinly plated as an adhesive layer.

PIQ coupler (Hitachi Ltd, Japan) as a coupling agent was coated onto the conductive metal lines and the photoresist on the metallic substrate. Then, polyimide (PIQ, Hitachi Ltd, Japan) was coated over the layer of coupling agent on the conductive metal lines and the photoresist of the metallic substrate, by means of screen printing. Thereafter, the polyimide film was dried at 100° C. to prevent a reaction of said film with the photoresist used in formation of the pattern. By UV laser, via holes were formed and plugged by copper plating.

Finally, the polyimide film comprising the conductive metal lines and the plugged via holes was separated from the metallic substrate. The separated polymer layer was superimposed on another polyimide layer which was subjected to the same procedure as mentioned above, under 2 kg/cm$^2$ at about 220° C., thereby manufacturing a multi-layered printed circuit board.

EXAMPLE 2

The PCB was fabricated in the same manner as in the above example 1, except that gold (Au) and nickel, functioning as an antioxidation film for prevention of oxidation and corrosion of the conductive metal lines, were successively plated, and then the conductive copper lines were plated over the gold-plated layer using the copper sulfate plating solution.

EXAMPLE 3

The PCB was fabricated in the same manner as in the above example 1, except that, upon formation of the pattern on the metallic substrate, a dry film (Ka series (50 μm, Kolon Corp., Korea), in place of the photoresist solution, was compressed and bonded to the metallic substrate and dried by known methods.

EXAMPLE 4

A rigid PCB was fabricated in the same manner as in the above example 1, except that FR-4 (Korea Fiber) and a prepreg (Korea Fiber) as a material of rigid circuits were applied in place of polyimide, and the prepreg was hot pressed at 150–180° C., the temperature inducing flowability thereof, overlaid on FR-4/prepreg/metallic substrate (wherein metallic substrate having conductive copper lines formed on pattern of stainless steel of example 1), compressed and separated from the conductive copper line-formed substrate to obtain the conductive copper line-attached polymer layer.

EXAMPLE 5

The PCB was fabricated in the same manner as in the above example 1, except that the via holes were plugged by copper plating followed by tin plating.

According to the present Invention, fabrication of POB is advantageous in terms of maximized efficiency of use of the surface area of the PCB due to not requiring a dummy line, by performing a pattern-forming process on the metallic substrate and plating the conductive metal lines thereon. In addition, the completed conductive metal lines are bonded to the polymer layer and then separated from the metallic substrate, whereby an etching process need not be performed and thus fineness and high integration of the circuit are possible.

Further, even without an etching process of the conductive copper lines, the via holes can be formed, and fine via holes can be completely plugged by means of electroplating.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of manufacturing a printed circuit board, comprising the following steps of:
   (a) plating a metal between patterns on a pattern-formed metallic substrate, to form a conductive metal line;
   (b) forming a polymer layer as a base substrate over the patterns and the conductive metal line formed between the patterns on the pattern-formed metallic substrate and drying the formed polymer layer, the conductive metal line being relatively weakly bonded to the metallic substrate compared to the polymer layer to permit separation of the conductive metal line from the metallic substrate without:
   (c) forming a via hole in the polymer layer, followed by plugging the formed via hole by means of electroplating; and
   (d) removing the metallic substrate without etching.

2. The method as set forth in claim 1, wherein the step (a) further comprises coating a coupling agent onto the patterns and the conductive metal line formed on the metallic substrate between the patterns.

3. The method as set forth in claim 1, wherein the step (a) further comprises forming a chromium layer on the conductive metal line.

4. The method as set forth in claim 1, wherein the metallic substrate is made of a material selected from the group consisting of stainless steel, aluminum and nickel.

5. The method as set forth in claim 1, wherein the conductive metal line is made of a material selected from the group consisting of copper, aluminum, chromium, tin, nickel, gold and alloys thereof.

6. The method as set forth in claim 1, wherein the polymer layer is made of a polymer selected from the group consisting of polyimides, polyimide resins and prepregs.

7. The method as set forth in claim 1, wherein the patterns on the pattern-formed metallic substrate are photoresist which has been dried at a drying temperature upon formation of the patterns on the metallic substrate, and wherein, in the step (b), the polymer layer is dried at a temperature lower than said drying temperature of said photoresist.

8. The method as set forth in claim 7, wherein the polymer layer is dried at 80–110° C.

9. The method as set forth in claim 1, wherein the via hole is formed by any one selected from the group consisting of YAG, CO$_2$ and UV lasers.

10. The method as set forth in claim 1, wherein the via hole is plugged with a metal selected from the group consisting of solder, tin, nickel, copper, chromium, aluminum, gold and alloys thereof.

* * * * *